(12) United States Patent
Liao et al.

(10) Patent No.: US 11,189,468 B2
(45) Date of Patent: Nov. 30, 2021

(54) MAGNETIC FILTER TUBE

(71) Applicants: Beijing Normal University, Beijing (CN); Wenli (Guangdong) Technology Co., Ltd., Yunfu (CN)

(72) Inventors: Bin Liao, Beijing (CN); Xiaoping Ouyang, Beijing (CN); Qingsong Hua, Beijing (CN); Jun Luo, Beijing (CN); Lin Chen, Beijing (CN); Xu Zhang, Beijing (CN); Xianying Wu, Beijing (CN); Pan Pang, Beijing (CN); Ran Han, Beijing (CN); Minju Ying, Beijing (CN); Weifeng He, Beijing (CN); Guangyu He, Beijing (CN)

(73) Assignees: Beijing Normal University, Beijing (CN); Wenli (Guangdong) Technology Co., Ltd., Yunfu (CN)

( * ) Notice: Subject to any disclaimer, the term of this patent is extended or adjusted under 35 U.S.C. 154(b) by 0 days.

(21) Appl. No.: 16/883,326

(22) Filed: May 26, 2020

(65) Prior Publication Data
US 2021/0175053 A1  Jun. 10, 2021

(30) Foreign Application Priority Data
Dec. 6, 2019 (CN) .......................... 201911239897.2

(51) Int. Cl.
*H01J 37/32* (2006.01)
*C23C 14/32* (2006.01)

(52) U.S. Cl.
CPC ...... *H01J 37/32669* (2013.01); *C23C 14/325* (2013.01); *H01J 37/32055* (2013.01); *H01J 2237/057* (2013.01); *H01J 2237/332* (2013.01)

(58) Field of Classification Search
None
See application file for complete search history.

(56) References Cited

U.S. PATENT DOCUMENTS

| | | | | |
|---|---|---|---|---|
| 5,840,163 | A * | 11/1998 | Welty | C23C 14/221 204/192.38 |
| 5,985,115 | A * | 11/1999 | Hartsough | H01J 37/3408 204/298.09 |
| 6,465,793 | B1 * | 10/2002 | Anders | H01J 37/32055 250/426 |
| 2003/0085123 | A1 * | 5/2003 | Shi | H01J 37/32779 204/298.41 |

* cited by examiner

*Primary Examiner* — Jason Berman
(74) *Attorney, Agent, or Firm* — Troutman Pepper Hamilton Sanders LLP; Christopher C. Close, Jr.

(57) ABSTRACT

The present invention discloses a magnetic filter tube, and relates to the technical field of magnetic filters. The magnetic filter tube includes a first rectangular tube and a second rectangular tube, where one end of the first rectangular tube is fixedly connected to one end of the second rectangular tube; the other end of the first rectangular tube forms an inlet of the magnetic filter tube; the inlet of the magnetic filter tube is connected with a cathode target flange; the other end of the second rectangular tube forms an outlet of the magnetic filter tube; the outlet of the magnetic filter tube is connected with a vacuum chamber; an inner wall of the first rectangular tube and an inner wall of the second rectangular tube are each provided with a protrusion and a groove; the protrusion is filled with cold water.

9 Claims, 3 Drawing Sheets

MAGNETIC FILTER TUBE

CROSS REFERENCE TO RELATED APPLICATIONS

This application claims priority, and benefit under 35 U.S.C. § 119(e) of Chinese Patent Application No. 201911239897.2 filed 6 Dec. 2019. The disclosure of the prior application is hereby incorporated by reference as if fully set forth below.

TECHNICAL FIELD

The present invention relates to the technical field of magnetic filters, and in particular, to a magnetic filter tube.

BACKGROUND

Filter cathodic vacuum arcdeposition (FCVA) is a new ion beam film preparation method developed in recent years. FCVA magnetically filters out large particles and neutral atoms generated by the arc source to obtain a pure plasma beam without large particles. FCVA effectively overcomes the problems caused by large particles in ordinary arc source deposition methods, so that the prepared film has excellent properties. FCVA can produce high-performance thin films, and can deposit high-quality films under a wide range of conditions. For metals, alloys and compounds, FCVA has a high deposition rate and good film uniformity. FCVA can deposit at a very low substrate temperature, thereby reducing the impact on the substrate material. When an alloy is used as a cathode, FCVA can uniformly ablate, so that the composition of the alloy is kept unchanged. FCVA can fill a reactive gas to facilitate the formation of a compound film and realize a high plasma density. However, FCVA still has great defects.

1. The small-sized magnetic filter tube yields a small-sized workpiece, which causes the magnetic filter system to fail in extending the plasma beam.

2. The filtering angle is made large in order for a good filtering effect of the magnetic filter elbow. However, by doing so, the plasma transmission efficiency is greatly reduced, which causes a great reduction in the subsequent film deposition rate.

SUMMARY

In order to solve the above problems existing in the prior art, an objective of the present invention is to provide a magnetic filter tube. The magnetic filter tube improves the film deposition efficiency and is beneficial to reduce the production cost.

To achieve the above purpose, the present invention provides the following technical solution.

The present invention provides a magnetic filter tube, including a first rectangular tube and a second rectangular tube, where one end of the first rectangular tube is fixedly connected to one end of the second rectangular tube; the other end of the first rectangular tube forms an inlet of the magnetic filter tube; the inlet of the magnetic filter tube is connected with a cathode target flange; the other end of the second rectangular tube forms an outlet of the magnetic filter tube; the outlet of the magnetic filter tube is connected with a vacuum chamber; an inner wall of the first rectangular tube and an inner wall of the second rectangular tube are each provided with a protrusion and a groove; the protrusion is filled with cold water.

Preferably, the first rectangular tube and the second rectangular tube are both copper tubes.

Preferably, there are a plurality of protrusions and grooves; the protrusions are spaced from the grooves, and any adjacent protrusion and groove are spaced by 2-10 mm.

Preferably, the protrusion has a width of 10-20 mm and a height of 2-10 mm.

Preferably, the groove has a depth of 2-5 mm and a width of 10-15 mm.

Preferably, the inlet of the magnetic filter tube is provided with a seal ring.

Preferably, a forward fan-shaped winding slot is fixed on the first rectangular tube near the inlet of the magnetic filter tube, and a backward fan-shaped winding slot is fixed on the second rectangular tube near the outlet of the magnetic filter tube.

Preferably, the magnetic filter tube further includes an inlet section coil and an outlet section coil, where the inlet section coil is wound according to the forward fan-shaped winding slot, and the outlet section coil is wound according to the backward fan-shaped winding slot.

Preferably, the forward fan-shaped winding slot and the backward fan-shaped winding slot each have a divergence angle of 0-40°.

Preferably, the inlet section coil and the outlet section coil each includes a transition coil and an extension coil; the transition coil is charged with a constant direct current (DC) while the extension coil is charged with a strong pulse current.

Compared with the prior art, the present invention achieves the following technical effects.

The present invention provides a magnetic filter tube. The magnetic filter tube adopts a rectangular tube, and the length of the rectangular tube is changed to make the extraction width of the magnetic filter tube arbitrary. An inner wall of a first rectangular tube and an inner wall of a second rectangular tube are each provided with a protrusion and a groove, which is beneficial to improve the film deposition efficiency and reduce the production cost. The protrusion is filled with cold water to ensure that a droplet loses energy immediately after contacting the protrusion and is thus adsorbed on a surface of the protrusion during normal operation. Such a protrusion structure greatly reduces the rebound probability of the droplet, which is conducive to reducing particle transmission and thereby improving the film deposition efficiency.

BRIEF DESCRIPTION OF DRAWINGS

To describe the technical solutions in the embodiments of the present invention or in the prior art more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

Where: 101. inlet of magnetic filter tube, 102. protrusion, 103. outlet of magnetic filter tube, 104. turning angle of magnetic filter tube, 201. forward fan-shaped divergence angle, 202. inlet section of magnetic filter tube, 203. forward fan-shaped winding slot, 204. backward fan-shaped winding slot, and 205. backward fan-shaped divergence angle.

DETAILED DESCRIPTION

The technical solutions in the embodiments of the present invention are described clearly and completely with reference to the accompanying drawings in the embodiments of the present invention. Apparently, the described embodiments are merely a part rather than all of the embodiments of the present invention. All other embodiments obtained by a person of ordinary skill in the art based on the embodiments of the disclosure without creative efforts should fall within the protection scope of the disclosure.

In order to solve the problems existing in the prior art, an objective of the present invention is to provide a magnetic filter tube. The magnetic filter tube improves the film deposition efficiency and is beneficial to reduce the production cost.

To make the above objectives, features, and advantages of the present invention more obvious and easy to understand, the present invention is described in further detail with reference to the accompanying drawings and the detailed description.

Figure 1:
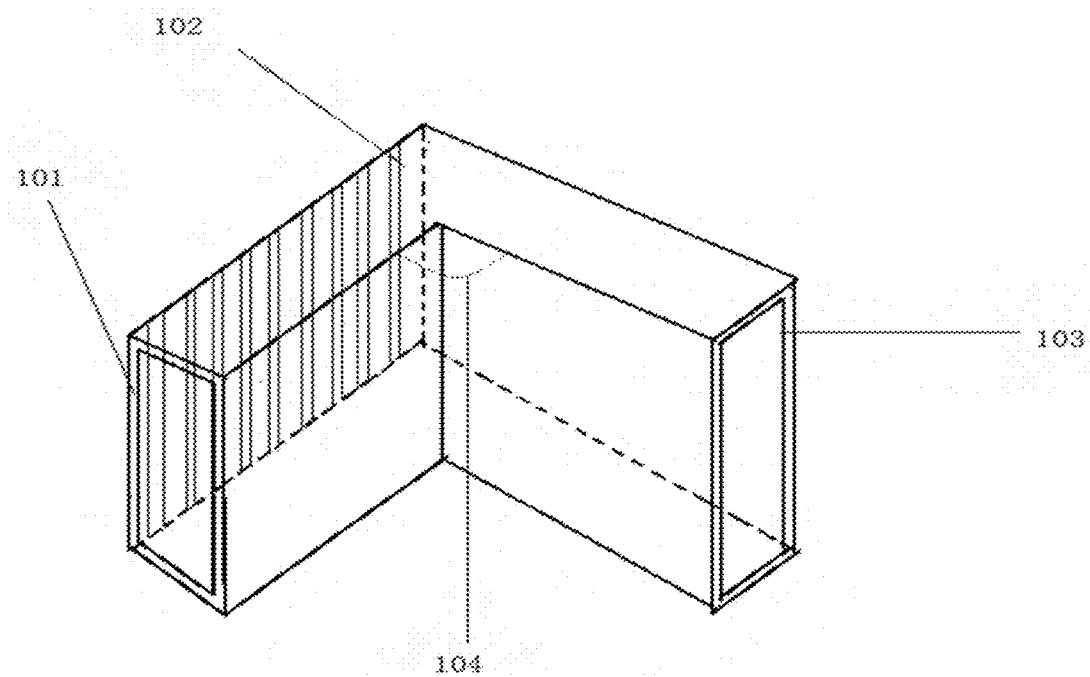
FIG. 1 is a schematic diagram of a magnetic filter tube provided by the present invention.
Figure 2:
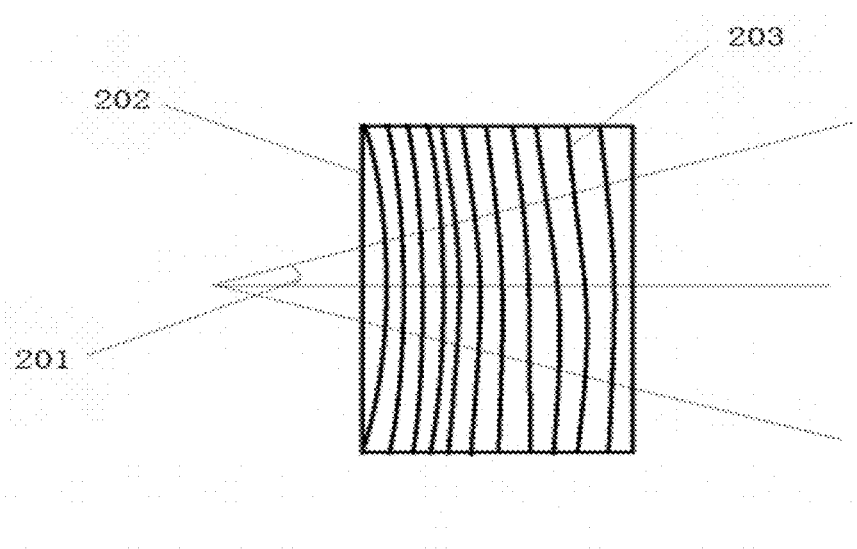
FIG. 2 is a diagram showing forward fan-shaped winding of a magnetic filter tube provided by the present invention.
Figure 3:
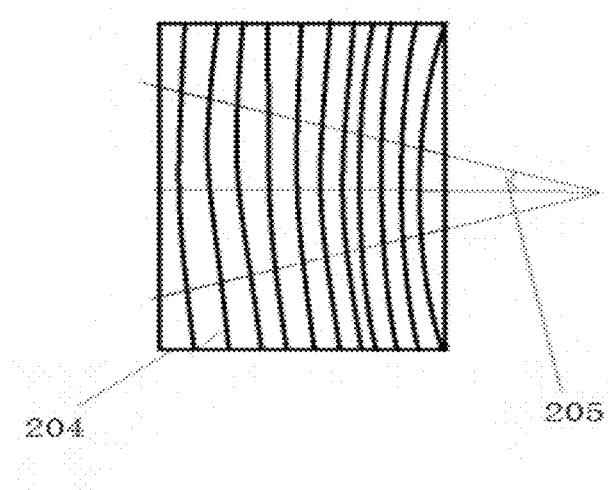
FIG. 3 is a diagram showing backward fan-shaped winding of a magnetic filter tube provided by the present invention.

As shown in FIG. 1 to FIG. 3, this embodiment provides a magnetic filter tube. The magnetic filter tube includes a first rectangular tube and a second rectangular tube. One end of the first rectangular tube is fixedly connected to one end of the second rectangular tube. The first rectangular tube and the second rectangular tube form a certain turning angle 104 of the magnetic filter tube, which is preferably 45-180°. The turning angle 104 of the magnetic filtering tube is mainly to remove a metal droplet and a particle, so as to provide a high-quality plasma for depositing a high-quality film. The other end of the first rectangular tube forms an inlet 101 of the magnetic filter tube. The inlet 101 of the magnetic filter tube is connected with a cathode target flange. The other ends of the second rectangular tube forms an outlet 103 of the magnetic filter tube. The outlet 103 of the magnetic filter tube is connected with a vacuum chamber to extract the plasma to coat a workpiece. An inner wall of the first rectangular tube and an inner wall of the second rectangular tube are each provided with a protrusion 102 and a groove. This structure improves the particle filtration effect, thereby greatly improving the film deposition efficiency and reducing the production cost. The protrusion 102 is filled with cold water, so that a droplet is immediately adsorbed on a surface of the protrusion 102 after contacting the protrusion during normal operation, which greatly reduces the rebound possibility of the droplet. Compared with the conventional magnetic filter method, in the case of the same magnetic filter angle, the present invention reduces the particle transmission and improves the film quality.

The first rectangular tube and the second rectangular tube both are preferably copper tubes.

There are a plurality of protrusions 102 and grooves. The protrusions 102 are spaced from the grooves, and the distance between any adjacent protrusion 102 and groove is preferably 2-10 mm.

The protrusion 102 has a width of preferably 10-20 mm and a height of preferably 2-10 mm.

The groove has a depth of preferably 2-5 mm and a width of preferably 10-15 mm.

The inlet 101 of the magnetic filter tube is provided with a seal ring.

A forward fan-shaped winding slot 203 is fixed on the first rectangular tube near the inlet 101 of the magnetic filter tube, that is, on the magnetic filter tube inlet section 202. A backward fan-shaped winding slot 204 is fixed on the second rectangular tube near the outlet 103 of the magnetic filter tube. The forward fan-shaped winding slot 203 and the backward fan-shaped winding slot 204 precisely control a winding angle.

The magnetic filter tube further includes an inlet section coil and an outlet section coil. The inlet section coil is wound according to the forward fan-shaped winding slot 203, and the outlet section coil is wound according to the backward fan-shaped winding slot 204. The forward fan-shaped winding greatly extends the plasma transmission range, and the backward fan-shaped winding partially compresses the plasma. The expansion and compression processes improve the plasma uniformity as well as the coating uniformity at the magnetic filter outlet.

In addition, since the inlet section coil of the magnetic filter tube is wound according to the forward fan-shaped winding slot 203, a magnetic field generated thereby causes an arc spot on a cathode surface to move toward an outer cathode diameter. This is beneficial to the consumption of the cathode target, greatly improving the utilization of the cathode target and further reducing the production cost.

The forward fan-shaped winding slot 203 and the backward fan-shaped winding slot 204 each have a divergence angle of 0-40°. The divergence angle of the forward fan-shaped winding slot 203 is called a forward fan-shaped divergence angle 201, and the divergence angle of the backward fan-shaped winding slot 204 is called a backward fan-shaped divergence angle 205. The divergence angles both are preferably 0-40°.

The inlet section coil and the outlet section coil both include a transition coil and an extension coil. The transition coil is charged with a constant direct current (DC) while the extension coil is charged with a strong pulse current.

The transition coil of the inlet section coil is charged with a constant DC, with a current intensity of preferably 1-10 A. The extension coil of the inlet section coil is charged with a strong pulse current, with a current intensity of preferably 20-200 A, a pulse frequency of preferably 1 Hz-1 KHz, and a pulse width of preferably 1-10000 μs.

The transition coil of the outlet section coil is charged with a constant DC, with a current intensity of preferably 1-5 A. The extension coil of the outlet section coil is charged with a strong pulse current, with a current intensity of preferably 10-100 A, a pulse frequency of preferably 1 Hz-1 KHz, and a pulse width of preferably 1-10000 μs. (During setting, the current intensity of the outlet section should not be greater than ½ that of the inlet section).

Specific examples are applied in this specification to describe the principle and implementations of the present invention. The description of the above embodiments is only intended to make the method and the core idea of the present invention comprehensible. For those of ordinary skill in the art, there will be changes in the specific implementations and the application scope in accordance with the concept of the present invention. In conclusion, the content of this specification should not be construed as a limitation to the present invention.

What is claimed is:

1. A magnetic filter tube, comprising a first rectangular tube and a second rectangular tube, wherein a first end of the first rectangular tube is fixedly connected to a first end of the second rectangular tube; a second end of the first rectangular tube forms an inlet of the magnetic filter tube; the inlet of the magnetic filter tube is connected with a cathode target flange; a second end of the second rectangular tube forms an outlet of the magnetic filter tube; the outlet of the magnetic filter tube is connected with a vacuum chamber; an inner wall of the first rectangular tube and an inner wall of the second rectangular tube are each provided with a protrusion and a groove; the protrusion is filled with cooling water, a forward fan-shaped winding slot is fixed on the first rectangular tube near the inlet of the magnetic filter tube, and a backward fan-shaped winding slot is fixed on the second rectangular tube near the outlet of the magnetic filter tube.

2. The magnetic filter tube according to claim 1, wherein the first rectangular tube and the second rectangular tube are each a copper tube.

3. The magnetic filter tube according to claim 1, wherein there are a plurality of protrusions and a plurality of grooves; each protrusion of the plurality of protrusions is spaced apart from an adjacent groove of the plurality of grooves by 2-10 mm.

4. The magnetic filter tube according to claim 1, wherein the protrusion has a width of 10-20 mm and a height of 2-10 mm.

5. The magnetic filter tube according to claim 1, wherein the groove has a depth of 2-5 mm and a width of 10-15 mm.

6. The magnetic filter tube according to claim 1, wherein the inlet of the magnetic filter tube is provided with a seal ring.

7. The magnetic filter tube according to claim 1, further comprising an inlet section coil and an outlet section coil, wherein the inlet section coil is wound according to the forward fan-shaped winding slot, and the outlet section coil is wound according to the backward fan-shaped winding slot.

8. The magnetic filter tube according to claim 1, wherein the forward fan-shaped winding slot and the backward fan-shaped winding slot each have a divergence angle of 0-40°.

9. The magnetic filter tube according to claim 7, wherein the inlet section coil and the outlet section coil each comprise a transition coil and an extension coil; the transition coil is charged with a constant direct current (DC) and the extension coil is charged with a strong pulse current.

* * * * *